(12) United States Patent
Sheffer

(10) Patent No.: US 11,226,788 B2
(45) Date of Patent: Jan. 18, 2022

(54) COMPARING AND MERGING COMPLEX DATA STRUCTURES

(71) Applicant: SHAPEDO LTD., Modi'in-Maccabim-Re'ut (IL)

(72) Inventor: Guy Sheffer, Kfar Saba (IL)

(73) Assignee: SHAPEDO LTD., Modi'in-Maccabim (IL)

( * ) Notice: Subject to any disclaimer, the term of this patent is extended or adjusted under 35 U.S.C. 154(b) by 208 days.

(21) Appl. No.: 16/068,966

(22) PCT Filed: Jan. 26, 2017

(86) PCT No.: PCT/IL2017/050100
§ 371 (c)(1),
(2) Date: Jul. 10, 2018

(87) PCT Pub. No.: WO2017/134651
PCT Pub. Date: Aug. 10, 2017

(65) Prior Publication Data
US 2019/0196784 A1    Jun. 27, 2019

Related U.S. Application Data

(60) Provisional application No. 62/289,345, filed on Feb. 1, 2016.

(51) Int. Cl.
| G06F 17/00 | (2019.01) |
| G06F 7/00 | (2006.01) |
| G06F 7/14 | (2006.01) |
| G06F 30/00 | (2020.01) |
| G06F 16/21 | (2019.01) |

(52) U.S. Cl.
CPC .............. *G06F 7/14* (2013.01); *G06F 16/219* (2019.01); *G06F 30/00* (2020.01)

(58) Field of Classification Search
CPC ........... G06F 7/14; G06F 16/219; G06F 30/00
USPC ........................................................ 707/695
See application file for complete search history.

(56) References Cited

U.S. PATENT DOCUMENTS

| 6,034,691 A * | 3/2000 | Aono .................... G06T 15/10 345/426 |
| 6,094,483 A * | 7/2000 | Fridrich ................ G06T 1/0021 375/E7.026 |
| 6,859,202 B2 * | 2/2005 | Teodosiadis ............ G06T 17/30 345/420 |
| 6,996,505 B1 * | 2/2006 | Edelsbrunner .......... G06T 17/20 345/419 |

(Continued)

OTHER PUBLICATIONS

International Search Report PCT/IL2017/050100 Completed May 8, 2017; dated May 11, 2017 3 pages.

(Continued)

*Primary Examiner* — Pavan Mamillapalli
(74) *Attorney, Agent, or Firm* — The Roy Gross Law Firm, LLC; Roy Gross

(57) ABSTRACT

The present disclosure presents methods, systems and modules for providing/enabling revision control for electronic files having non-textual content by deconstructing the non-textual content to elementary objects, representing the elementary objects in a systematic format using a surjective representation methodology/function and generating an electronic file in the systematic format by aggregating the elementary object representation.

20 Claims, 11 Drawing Sheets

(56) References Cited

U.S. PATENT DOCUMENTS

| | | | |
|---|---|---|---|
| 7,103,499 B2* | 9/2006 | Goodwin | G06F 3/016 318/568.11 |
| 7,681,136 B2* | 3/2010 | Gennaro | G06Q 10/10 715/751 |
| 9,471,556 B2* | 10/2016 | Little | G06F 16/972 |
| 9,736,366 B1* | 8/2017 | Barron | G06K 9/6203 |
| 2006/0112332 A1* | 5/2006 | Kemp | G06F 40/169 715/255 |
| 2006/0239548 A1* | 10/2006 | George Gallafent | G06T 7/194 382/164 |
| 2006/0263133 A1* | 11/2006 | Engle | G06Q 10/00 400/62 |
| 2006/0269130 A1* | 11/2006 | Maroy | G06T 7/143 382/173 |
| 2007/0094588 A1* | 4/2007 | Klassen | G06F 16/9577 715/210 |
| 2008/0104140 A1* | 5/2008 | Vierich | G06F 8/71 707/999.202 |
| 2008/0278633 A1* | 11/2008 | Tsoupko-Sitnikov | H04N 5/144 348/699 |
| 2010/0244834 A1* | 9/2010 | Mori | G01R 33/56341 324/310 |
| 2011/0090219 A1* | 4/2011 | Kruglick | G06Q 30/02 345/420 |
| 2011/0298822 A1* | 12/2011 | Bertholon | G06T 15/503 345/629 |
| 2012/0060131 A1* | 3/2012 | Ivansen | G03F 7/70508 716/55 |
| 2013/0287275 A1* | 10/2013 | Stiles | G16H 50/50 382/128 |
| 2014/0169697 A1* | 6/2014 | Breckenridge | G06Q 30/0621 382/284 |
| 2014/0180641 A1 | 6/2014 | Lee et al. | |
| 2015/0088861 A1* | 3/2015 | Dobinson | G06F 30/30 707/722 |
| 2015/0127301 A1 | 5/2015 | Seibold et al. | |
| 2015/0161151 A1* | 6/2015 | Koryakina | G06F 9/45558 711/114 |
| 2015/0243035 A1* | 8/2015 | Narasimha | G06T 7/344 382/154 |
| 2016/0232678 A1* | 8/2016 | Kurz | G06F 30/00 |

OTHER PUBLICATIONS

Written Opinion of the International Searching Authority PCT/IL2017/050100 dated May 11, 2017 4 pages.

\* cited by examiner

COMPARING AND MERGING COMPLEX DATA STRUCTURES

RELATED APPLICATIONS

This application is a National Phase of PCT Patent Application No. PCT/IL2017/050100 having International filing date of Jan. 26, 2017, which claims the benefit of priority of U.S. Provisional Application No. 62/289,345 filed on Feb. 1, 2016 entitled COMPARING AND MERGING COMPLEX DATA STRUCTURES. The contents of the above applications are all incorporated by reference as if fully set forth herein in their entirety.

TECHNICAL FIELD

The present disclosure generally relates to the field of electronic revision/version control.

BACKGROUND

Editing electronic files, especially complex files, is an evolving gradual activity in which different parts of the files may be added or edited at different times and by different users at the same time. Managing the multiple edits can be challenging as the files get more complex and more users are involved in the editing/reviewing process.

Some methodologies have been developed for handling this challenge, for example: an electronic file may be stored in a repository server, and a permission to edit the file may be granted users by providing a copy of the repository file to each user (Check-out). When a user finishes the intended edit/change, the new file may be saved as a new revision of the repository (Check-in), and when other users need to submit their changes, they may compare their changes with the updated repository and merge the files to create a new repository. This process is called revision control and/or version control.

Current revision control systems provide a solution for revision control of electronic text files and files wherein the basic building blocks are textual, such as code. However, a crucial element in the revision control process is the ability of computer programs to compare elements in order to manage changes. Alas, current revision control systems do not support all functionalities for revision control of complex data structures signifying non-textual elements.

There is thus a need in the art for revision control systems of electronic files signifying non textual elements.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other advantages or improvements.

The ability to compare between different versions of data contained within files for finding the differences and commonalities therebetween is a cardinal property for assessing the changes between different revisions of files and operating a revision control system. This ability is available in text-based electronic documents, as the text is represented unambiguously, and a certain textual content may be compared with other text content for the characters of the text have unique representation.

Alas, in non-textual content, the ability of comparing between data elements of different revisions of a file or different files is impaired, and one of the reasons for this is that a single non-textual object may be represented in more than one electronic format, and the specific representation is commonly chosen based on system memory and performance properties or other arbitrary or random methods. If the same content can be represented differently in two versions, it is not reliable to compare between the versions using electronic means because the software does not know to distinguish between changes and different representation of same elements. As a result, it is very difficult to compare non-textual content even if the content is non-complex.

Another challenge in many file formats/representations is that elements are built with dependencies between various sub elements. According to some embodiments, the dependencies between elements are untangled and structures are deconstructed to obtain representation of independent elementary elements.

Advantageously, untangling the dependencies between elementary objects may enable comparing sub elements instead of complex structures, while not losing pertinent/material data in the process. Because text is granular in nature, each of the characters (elementary text objects) is represented in the same way regardless of conjunction with other characters and position within a surrounding text. In non-textual content, many structures contain dependencies between elements, for example a shared point or a shared line may be represented only once, thus a change in one element results in a change of the representation of the second elements, even if the second element was not changed. Therefore untangling dependencies between objects may enable detecting and comparing changes with elementary objects without impairing the comparability of otherwise dependent objects.

Another challenge with representing non-textual information is the representation of values (numbers) related to the non-textual content, as different systems may round and represent the values differently and hinder the ability to compare between two values as two equal values may be represented differently.

According to some embodiments, there are provided herein devices, systems and methods for providing comparison and/or revision control abilities for electronic files having data signifying non-textual content by methodically converting the representation of the non-textual content to a systematic format. According to some embodiments, converting the representation of files signifying non-textual content to a systematic format comprises utilizing a surjective unambiguous representation of non-textual content or elementary objects thereof, wherein the surjective representation is surjective onto a plurality of possible ambiguous representations in a common/native file format. Advantageously, converting the files signifying non textual content to a systematic format may enable comparing between different files or different revisions of files signifying non-textual content. According to some embodiments, converting the representation of the non-textual content to a systematic format includes untangling dependencies between sub elements. Advantageously, once sub elements are untangled, comparisons between versions can distinguish between sub elements that have changed and sub elements that have remained identical in the non-textual content they signify.

According to some embodiments, converting the representation of the non-textual content to a systematic format includes rounding values/numbers to a predetermined resolution. Advantageously, rounding the values (numbers) may prevent a false diff comparison between two similar values resulting from a difference in computerized representation of the values.

According to some embodiments, there is provided a version control method for electronic files signifying non-textual content, the method including converting an electronic file signifying non-textual content to a systematic format, wherein the systematic format is configured to enable comparing between different versions of the file by representing elementary non-textual objects in a surjective representation thereby facilitating consistent comparison between elements in the file in different versions.

According to some embodiments, there is provided a method for merging electronic files signifying non-textual content, the method including: obtaining a first electronic file in a first format and a second electronic file in a second format signifying non textual content, converting the first electronic file and the second electronic file to a systematic format, merging the first electronic file and the second electronic file to generate a merged electronic file in the systematic format, wherein the systematic format is configured to enable comparing between different electronic files by representing elementary non-textual objects in a surjective representation thereby facilitating consistent comparison between elements in the files in different versions and/or files.

According to some embodiments, the method further includes converting the merged electronic file to the first format and/or the second format. According to some embodiments, the first format and the second format are different formats.

According to some embodiments, there is provided a revision control method for electronic files representing non-textual content, the method including obtaining a first electronic file, including data signifying non-textual content in a first format, deconstructing the non-textual content data to elementary non-textual objects having a representation in the first format, methodically converting the representation of the elementary non-textual objects from the first format to a systematic format, aggregate the representation of the elementary non-textual objects in the systematic format, to generate a second electronic file including data signifying the non-textual content in the systematic format, wherein methodically converting the representation of the elementary non-textual objects from the first format to the systematic format includes utilizing a surjective representation of the elementary non-textual object.

According to some embodiments, the method further includes storing the second electronic file in a repository server, the repository server configured to store versions/revisions of files for providing version/revision control for the files. According to some embodiments, the method further includes comparing the second electronic file with a third file, the third file including data signifying non-textual content in the systematic format. According to some embodiments, the method further includes generating a comparison report indicative of differences and/or commonalities between the second electronic file and the third electronic file.

According to some embodiments, the method further includes providing a non-textual (visual) comparison between the second electronic file and the third electronic file by presenting the comparison report in a non-textual representation. According to some embodiments, the method further includes generating a merged file in the systematic format by merging the second electronic file with the third electronic file. According to some embodiments, the method further includes generating a merged file by selecting an origin of differences from the comparison report, the origin of differences being the second electronic document or the third electronic document.

According to some embodiments, the non-textual content include geometric content and the systematic textual format includes a surjective representation of polygons and/or Non-uniform rational basis splines (NURBS) based on coordinates and/or vector properties. According to some embodiments, the geometric content includes a three-dimensional model for 3D-printing. According to some embodiments, the geometric content includes a three/two-dimensional model for a construction plan. According to some embodiments, the geometric content includes a three/two-dimensional model for an automotive plan. According to some embodiments, the geometric content includes a three/two-dimensional model for molding. According to some embodiments, the non-textual content includes visual programming content.

According to some embodiments, there is provided a revision control system for electronic files representing non-textual content, the system including a non-transitory memory, configured for storing thereon a repository revision of an electronic file, and a processing circuitry configured to obtain a first electronic file, including data signifying non-textual content in a first format deconstruct the non-textual content data to elementary non-textual objects having a representation in the first format, methodically convert the representation of the elementary non-textual objects from the first format to a systematic format, and aggregate the representation of the elementary non-textual objects in the systematic format, to generate a second electronic file including data signifying the non-textual content in the systematic format wherein methodically converting the representation of the elementary non-textual objects from the first format to the systematic format includes utilizing a surjective representation of the elementary non-textual object.

According to some embodiments, the processing circuitry is further configured to store the second electronic file in a repository server, the repository server configured to store versions/revisions of files for providing version/revision control for the files. According to some embodiments, the processing circuitry is further configured to compare the second electronic file with a third file, the third file including data signifying non-textual content in the systematic format. According to some embodiments, the processing circuitry is further configured to generate a comparison report indicative of differences and/or commonalities between the second electronic file and the third electronic file. According to some embodiments, the processing circuitry is further configured to provide a non-textual (visual) comparison between the second electronic file and the third electronic file by presenting the comparison report in a non-textual representation.

According to some embodiments, the processing circuitry is further configured to generate a merged file in the systematic format by merging the second electronic file with the third electronic file. According to some embodiments, the processing circuitry is further configured to generate a merged file by selecting an origin of differences from the comparison report, the origin of differences being the second electronic document or the third electronic document.

According to some embodiments, there is provided a data structure for representing non-textual content in a systematic format based on any of the abovementioned embodiments.

According to some embodiments, there is provided a data stream carrying a data structure according to the abovementioned embodiments.

According to some embodiments, there is provided a file format convertor configured to obtain a first electronic file, including data signifying non-textual content in a first format, deconstruct the non-textual content data to elementary non-textual objects having a representation in the first format, methodically convert the representation of the elementary non-textual objects from the first format to a systematic format, and aggregate the representation of the elementary non-textual objects in the systematic format, to generate a second electronic file including data signifying the non-textual content in the systematic format.

According to some embodiments, there is provided an operating system, configured to operate a method according to the abovementioned embodiments.

According to some embodiments, there is provided a data carrier, carrying a middleware as described in the abovementioned embodiments. According to some embodiments, there is provided a computer program product, configured to operate a middleware as described in the abovementioned embodiments.

Certain embodiments of the present disclosure may include some, all, or none of the above advantages. One or more technical advantages may be readily apparent to those skilled in the art from the figures, descriptions and claims included herein. Moreover, while specific advantages have been enumerated above, various embodiments may include all, some or none of the enumerated advantages.

In addition to the exemplary aspects and embodiments described above, further aspects and embodiments will become apparent by reference to the figures and by study of the following detailed descriptions.

BRIEF DESCRIPTION OF THE DRAWINGS

Examples illustrative of embodiments are described below with reference to figures attached hereto. In the figures, identical structures, elements or parts that appear in more than one figure are generally labeled with a same numeral in all the figures in which they appear. Alternatively, elements or parts that appear in more than one figure may be labeled with different numerals in the different figures in which they appear. Dimensions of components and features shown in the figures are generally chosen for convenience and clarity of presentation and are not necessarily shown in scale. The figures are listed below.

DETAILED DESCRIPTION

Figure 1:
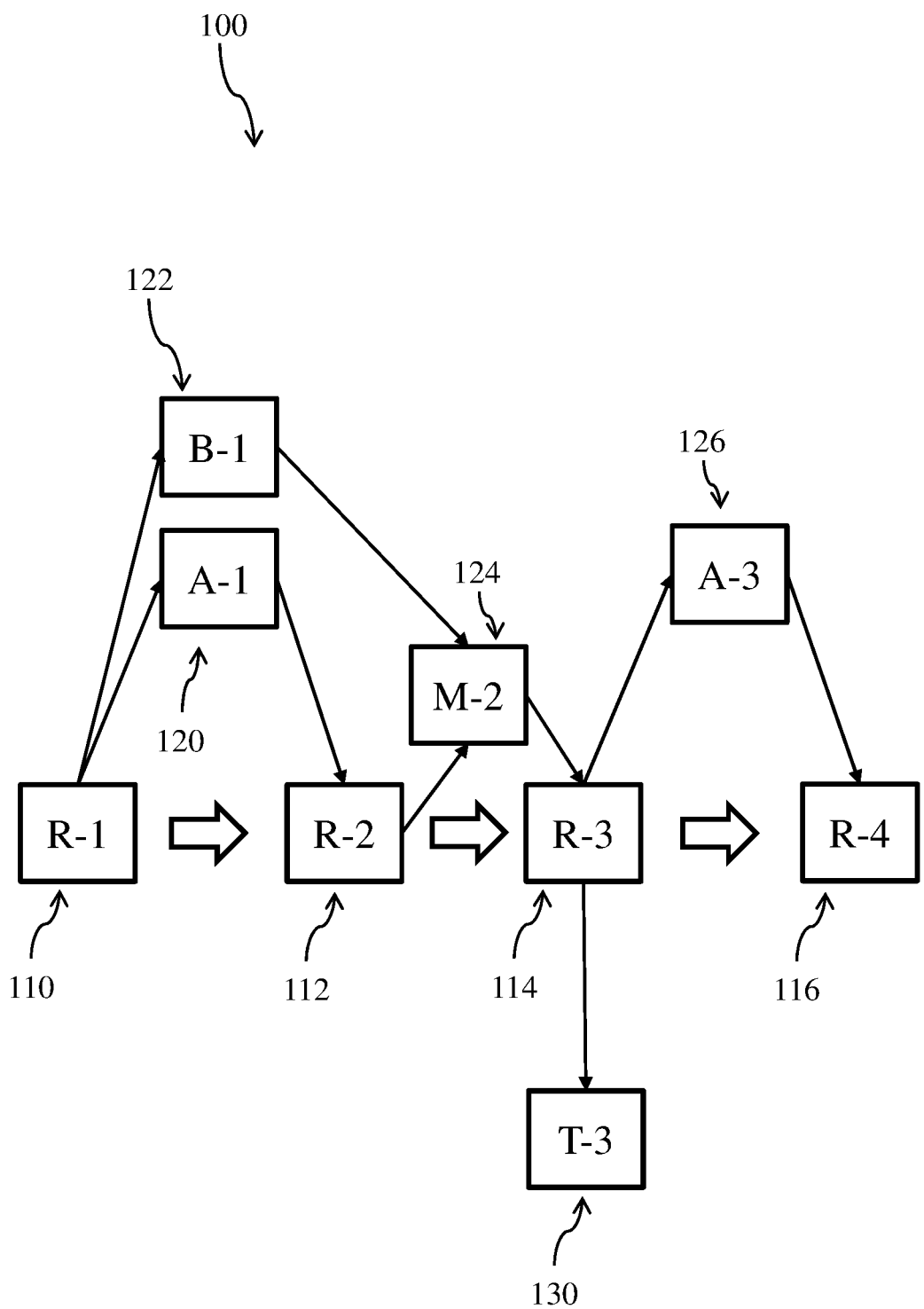
FIG. 1 schematically illustrates a revision control scheme, according to some embodiments.

In the following description, various aspects of the disclosure will be described. For the purpose of explanation, specific configurations and details are set forth in order to provide a thorough understanding of the different aspects of the disclosure. However, it will also be apparent to one skilled in the art that the disclosure may be practiced without specific details being presented herein. Furthermore, well-known features may be omitted or simplified in order not to obscure the disclosure.

The ability to compare between different versions of data contained within files for finding the differences and commonalities therebetween is a cardinal property for assessing the changes between different revisions of files and operating a revision control system. This ability is available in text-based electronic documents, as the text is represented unambiguously, and a certain textual content may be compared with other text content for the characters of the text have unique representation.

Alas, in non-textual content, the ability of comparing between data elements of different revisions of a file or different files is impaired, and one of the reasons for this is that a single non-textual object may be represented in more than one electronic format, and the specific representation is commonly chosen based on system memory, performance properties or other arbitrary or random methods. If the same content can be represented differently in two versions, it is not reliable to compare between the versions using electronic means because the software does not know to distinguish between changes and different representation of same elements. As a result, it is very difficult to compare non-textual content even if the content is non-complex.

Another challenge in many file formats/representations is that elements are built with dependencies between various sub elements. According to some embodiments, the dependencies between elements are untangles and structures are deconstructed to obtain representation of independent elementary objects.

Advantageously, untangling the dependencies between elementary objects may enable comparing sub elements instead of complex structures, while not losing any data in the process. Because text is granular in nature, each of the characters (elementary text objects) is represented in the same way regardless of conjunction with other characters and position within a surrounding text. In non-textual content, many structures contain dependencies between elements, for example a shared point or a shared line may be represented only once, thus a change in one element results in a change of the representation of the second elements, even if the second element was not changed. Therefore untangling dependencies between objects may enable detecting and comparing changes with elementary objects without impairing the comparability of otherwise dependent objects.

Another challenge with representing non-textual information is the representation of values (numbers) related to the non-textual content, as different systems may round and represent the values differently and hinder the ability to compare between two values as two equal values may be represented differently.

According to some embodiments, there are provided herein devices, systems and methods for providing comparison and/or revision control abilities for electronic files having data signifying non-textual content by methodically converting the representation of the non-textual content to a systematic format. According to some embodiments, converting the representation of files signifying non-textual content to a systematic format includes utilizing a surjective unambiguous representation of non-textual content or elementary objects thereof. Advantageously, converting the files signifying non textual content to a systematic format may enable comparing between different files or different revisions of files signifying non-textual content. According to some embodiments, converting the representation of the non-textual content to a systematic format includes untangling dependencies between sub elements. Advantageously, once sub elements are untangled, comparisons between versions can distinguish between sub elements that have changed and sub elements that have remained identical in the non-textual content they signify.

According to some embodiments, converting the representation of the non-textual content to a systematic format includes rounding values/numbers to a predetermined resolution. Advantageously, rounding the values (numbers) may prevent a false diff comparison between two similar values resulting from a difference in computerized representation of the values.

According to some embodiments, converting the representation of the non-textual content to a systematic format includes rounding values/numbers to a predetermined resolution. Advantageously, rounding the values (numbers) may prevent a false diff comparison between two similar values resulting from a difference in computerized representation of the values.

Common revision control systems utilize a server with a revision control program/software operated thereon, and provides a user of the system with some functions for controlling the revisions of a file or a branch of files. Some of the basic functions may include: creating a new branch, adding files to the repository, removing files from the repository, creating a tag/label for a certain revision of a branch or file, providing an editable copy of a selected revision/tag to a user by checking out the revision or certain files therein. Once changes are made to a checked-out file, the system enables checking-in (committing the changes) a version of the repository that includes the new file back to the repository server, and based on whether other changes were made to the repository files since the check-out, the user may be able to merge the changes with the updated repository version. According to some embodiments, the version control system may control such operations in a tree level hierarchical order rather than on the individual files level. According to some embodiments, The server may also provide tools for comparison between files ("diff") to show the differences; merge tools to enable the combination of files and branches, which may be useful for example, in a case of parallel development; and conflict resolution tools for the selection of changes between different revisions of the file, which may be useful for example in case of conflicting changes.

Reference is now made to FIG. 1, which schematically illustrates a revision control scheme 100, according to some embodiments. According to some embodiments, a first revision of a file R1 100 may be added to the repository, then two users may check-out the file for editing, and the revision control system may then provide each user with their own copy of the file and create a local copy for the first user A-1 120 and a local copy for the second user B-1 122. The first user may edit his copy A-1 120 and check-in the changes back to the revision control server, thereby create a new revision in the repository R-2 112 and at a later time, the second user may finish their own changes and merge their file B-1 122 with the updated repository file R-2 112 to create a merged file M-2 124 and check-in merged file M-2 124 to the repository server as a new repository revision R-3 114. The server may enable tagging/labeling/defining of a hash function for desired revisions to be able to address them at a later stage by their tag/label/commit hash, for example, R-3 114 may be tagged as T-3 130 for later reference. When the first user may need to edit the file, they will have access to the latest repository revision R-3 114, which may be checked-out to create a local copy for the first user A-3 126 which may be edited and checked-in to the repository to be saves as R-4 116.

Other capabilities that may be provided by the revision control server may include branch function, for creating two branches of revisions in the repository server, wherein each branch can be accessed independently and their progress and repository files may differ after the branch. Additionally, a revision control server may provide a merge function for merging two branches back to one branch by merging the files and aggregating changes in files to a single revision.

The above-mentioned functions and more, rely on the ability to compare between that data contained within different revisions of a file, to assess where the changes have occurred, what are those changes, are there any conflicts between files and managing the conflicts for merges and diffs.

In electronic files that signify textual content (namely: Code), the representation of text as characters and strings is unambiguous and independent, therefore, if no changes were made to a file or parts thereof, you may compare it with the repository revision and tell that changes were not made in certain segments, as their representation is not changed, while if a change was made to a part of the document, comparing the representations may provide us with the exact changes.

On the other hand, in electronic files that signify non-textual content, such as geometric or graphical content, the representation of the content is ambiguous and multiple representations can be associated with the same object, therefore, the representation of an object may change over time or between different systems even without having any change made to the object, and the ability to compare changes between files signifying non-textual data is lost.

According to some embodiments, the repository system may methodically convert the files to a systematic format, in which the representation of elements is independent of other elements and surjective (where the systematic format is the codomain and the original file is the domain, and every element of the codomain is mapped to by at least one element of the domain), such that each element may have a unique unambiguous representation in the systematic format that does not vary over time and does not depend on the status of the system or other elements According to some embodiments, the repository server may include a bridge/converter for converting the files to the systematic format for revision control purposes, and convert them to native formats for users to use and edit.

Figure 2:
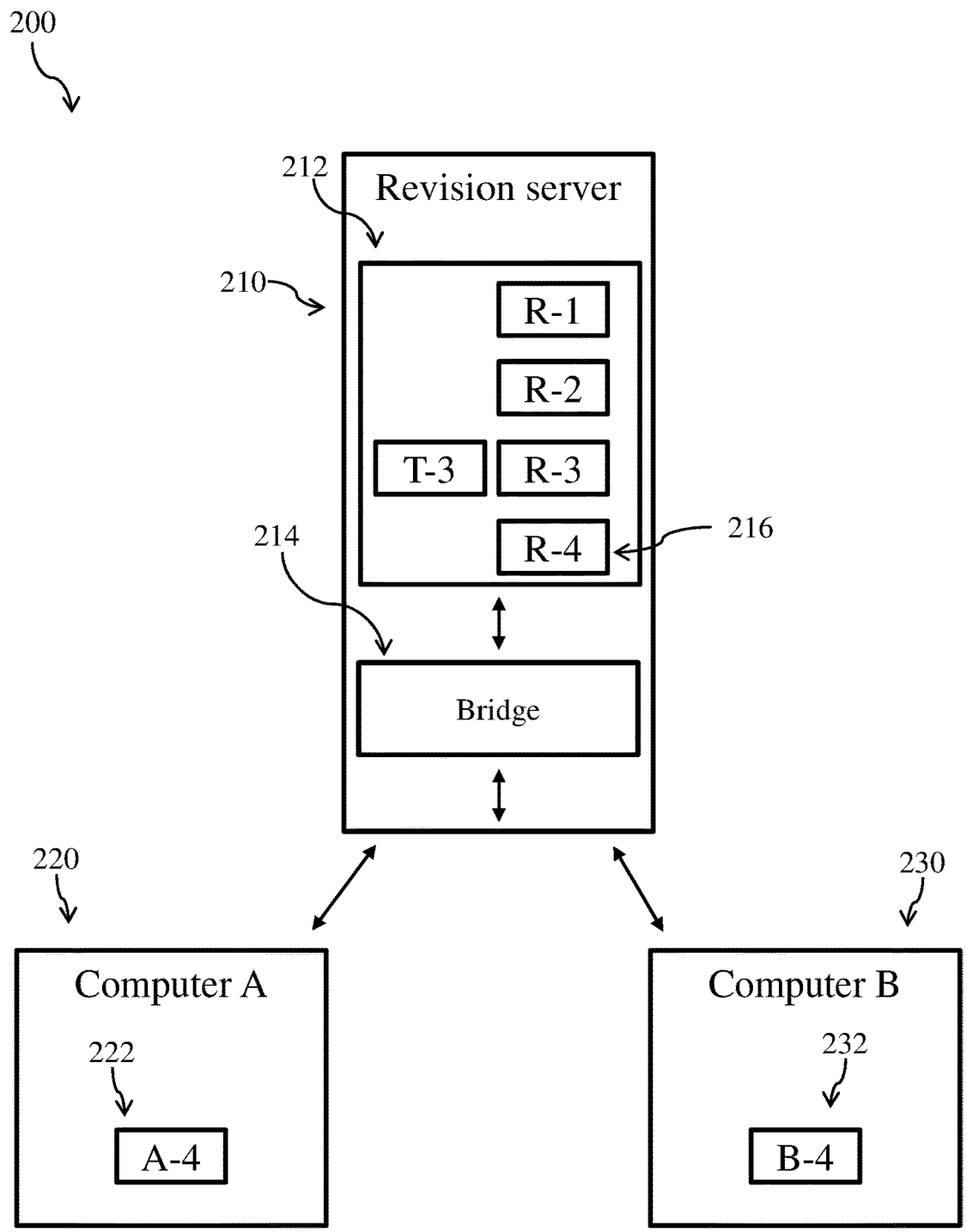
FIG. 2 schematically illustrates a revision control system with two users, according to some embodiments.

Reference is now made to FIG. 2, which schematically illustrates a revision control system 200 with a revision server 210, a first user such as computer A 220 and a second user such as computer B 230, according to some embodiments. According to some embodiments, Computer A 220 may have operated thereon a first computer aided design (CAD) tool, which is compatible with a first format/representation of non-textual content, while Computer B 230 may have operated thereon a second CAD tool, which is compatible with a second format/representation of non-textual content.

According to some embodiments, revision server 210 may be configured to have a repository 212 for storing thereon various revisions and branches of electronic documents with data signifying non-textual content in a systematic format, and revision server 210 may also have a conversion engine, such as bridge 214 configured to convert files signifying non-textual content to and from the systematic format and other formats/representations. According to some embodiments, a revision such as R-4 216 stored on repository 212, may be checked out by Computer A 220 for local editing, by converting the format of R-4 216 to the first format utilizing Bridge 214 and providing the revision of the file to computer A in a first format A-4 222, while R-4 216 may also be checked out by Computer B 230 for local editing, by converting the format of R-4 216 to the second format utilizing Bridge 214 and providing a the revision of the file to computer B in a second format B-4 232.

According to some embodiments, Computer A may check-in file A-4 222 back to revision server 210, and the file would be converted to the systematic format by bridge 214 and stored as a new revision in repository 212. And when computer B 230 wishes to check in file B-4 232 after changes, it is converted to the systematic format by bridge 214 and may then be merged with the latest repository revision as checked-in by Computer A 220.

According to some embodiments, a server may include a computer with a processing circuitry and a non-tangible memory associated with the processing circuitry. According to some embodiments, the server may be a distributed computer/server, wherein Data and commands may be distributed between more than one computer and different processing circuitries. According to some embodiments, the server may include a cloud server, online server, offline server, local or remote server. According to some embodiments, the server may have an operating system operated thereon to provide kernel instructions and system interface between the program intended to be operated on the server and the server hardware. According to some embodiments, the operating system may be a virtual operating system.

According to some embodiments, the repository server may have stored thereon revisions of files and/or branches of files in a common/native format, and upon request of diff/merge, one or more of the files may be converted to the systematic format for comparison/merge purposes, and then the new file(s) or revision(s) may be converted back to the common/native format.

Figure 3:
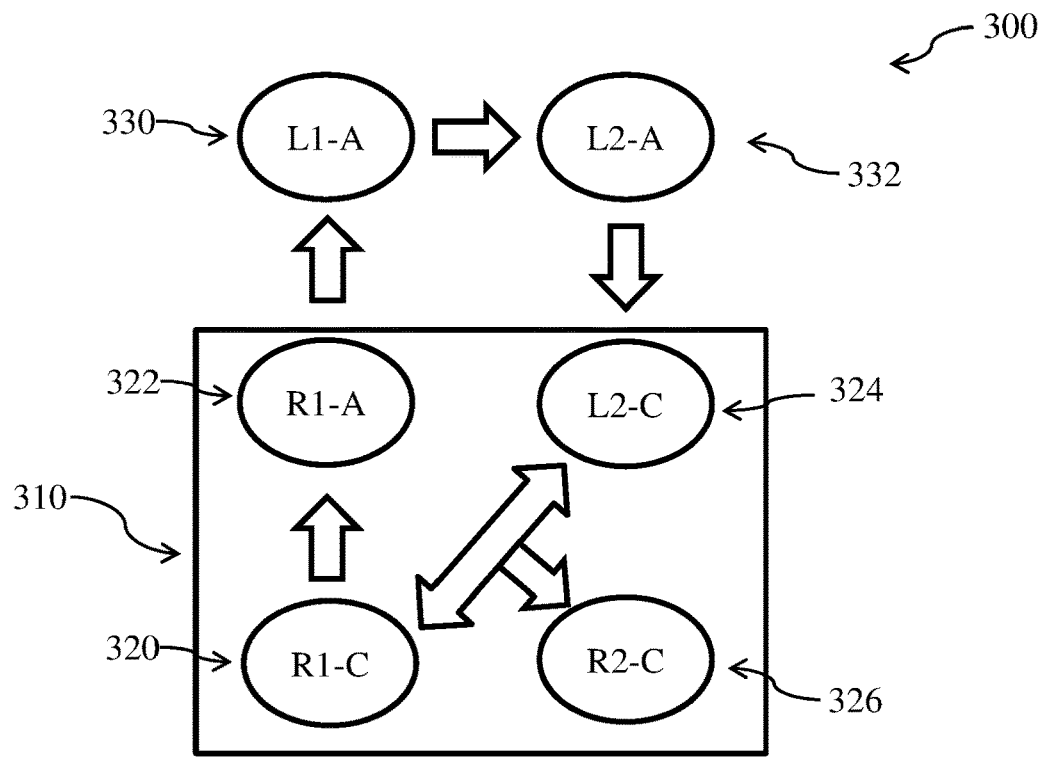
FIG. 3 schematically illustrates a revision control scheme with an external format, according to some embodiments.

Reference is now made to FIG. 3, which schematically illustrates a revision control scheme 300 with an external format, according to some embodiments. According to some embodiments, a revision control server 310 may have stored thereon a first revision of a file in a systematic format R1-C 320, upon check-out request, R1-C 320 may be converted to a format compatible with a CAD system/tool operated by the requesting user to generate a repository revision in a first format R1-A 322, which may be provided to a user as a local copy L1-A 330. The user may edit and make changes to L1-A 330 locally, and save local revisions such as L2-A 332, and when the user requests a check-in of the latest local revision L2-A 332, it is converted by the server to the systematic format and stored in the server as L2-C 324, which may then be compared and merged with the original repository revision of the file in the systematic format R1-C 320 and a new repository revision may be created R2-C 326.

Figure 4:
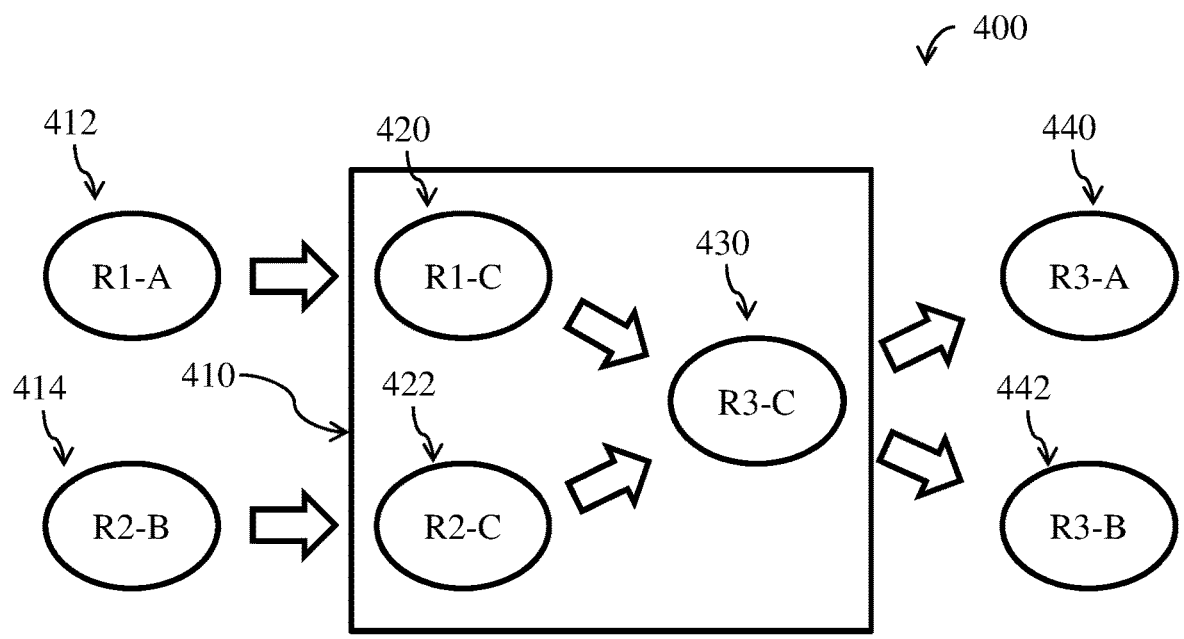
FIG. 4 schematically illustrates a revision control scheme with two external formats, according to some embodiments.

Reference is now made to FIG. 4, which schematically illustrates a revision control scheme 400 with two external formats, according to some embodiments. According to some embodiments, a revision control server 410 may obtain a first file R1-A 412 in a first format, and a second file R2-B 414 in a second format, and the server may be requested to merge the obtained files. To accomplish the request, revision control server 410 may convert R1-A 412 to the systematic format to generate R1-C 420 and convert R2-B 414 to the systematic format to generate R2-C 422. Once the files are in the systematic format, revision control server 410 may compare and merge the files R1-C 420 and R2-C 422 to a merged file R3-C 430, and then, automatically or upon request, convert the merged file to the first format R3-A 440 and/or the second format R3-B 442.

Figure 5:
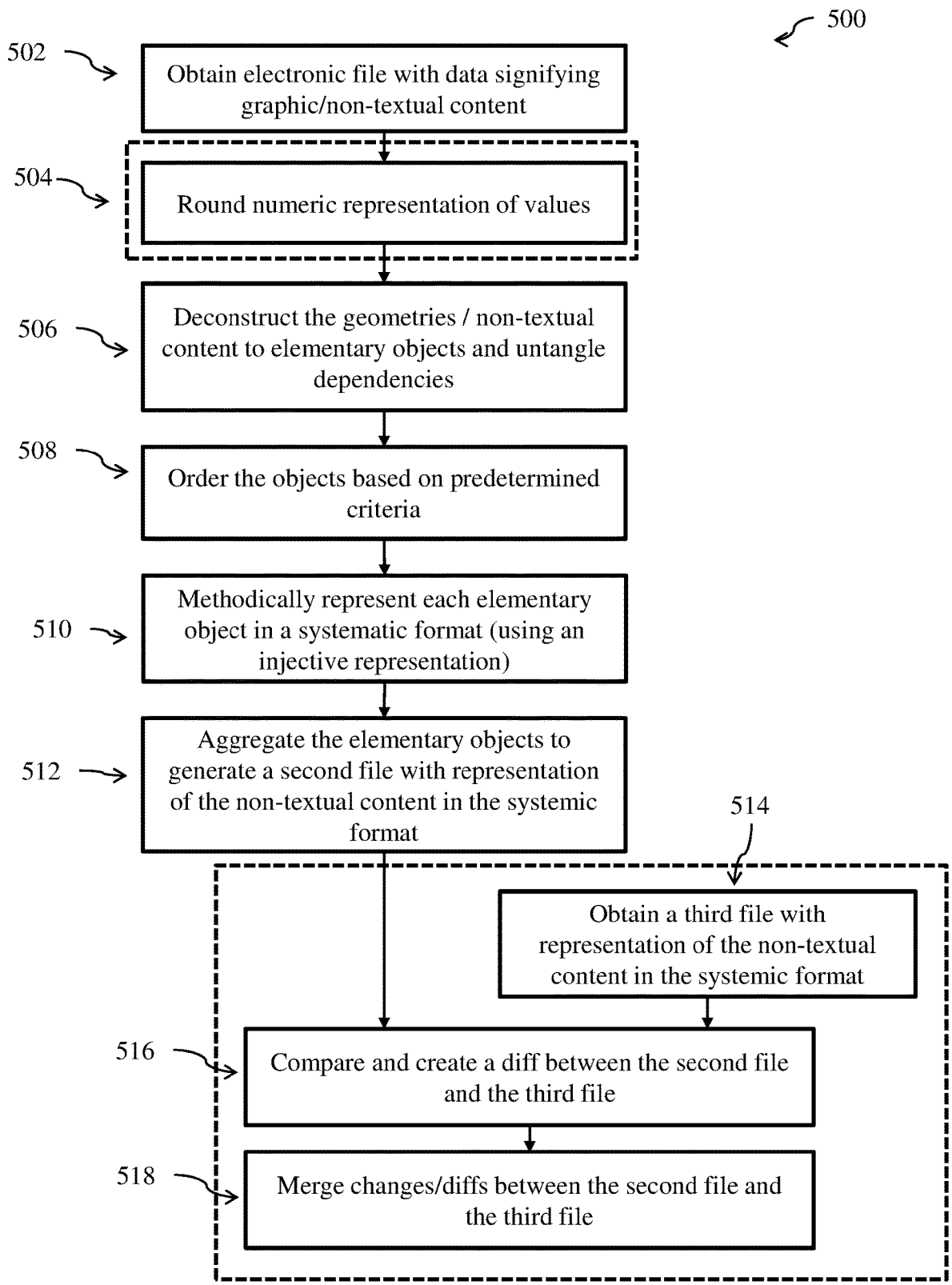
FIG. 5 schematically illustrates a method for revision control of non-textual content, according to some embodiments.

Reference is now made to FIG. 5, which schematically illustrates a method 500 for revision control of non-textual content, according to some embodiments.

According to some embodiments, method 500 begins with obtaining an electronic file(s) or branch with data signifying non-textual content (step 502), then optionally rounding the numbers/values to a predetermined resolution (step 504) to prevent false diffs due to different representations of the same value, then deconstructing the data signifying the non-textual content to elementary objects and untangle dependencies between elementary object (step 506), then ordering the objects based on a predetermined criteria or orientation (step 508), then methodically representing the elementary objects in a systematic format/representation using a surjective transformation/function (step 510) (According to some embodiments, step 510 may be achieved using a predetermined surjective function from the original data format to the systematic format such that an surjective function/transformation from the systematic format to the original data is assured/guaranteed, as many representations of a single signified element in the original file-type translate to a predetermined single representation in the systematic format).

According to some embodiments, method 500 may then proceed with aggregating the systematic representations of the elementary objects to generate a second file in the systematic format (step 512). Optionally, according to some embodiments, method 500 may obtain a third file in the systematic format (step 514) and compare the second file with the third file to create a diff report (step 516) and, given a common ancestor of the second and third files, merge the changes between the second file and the third file (step 518).

According to some embodiments, method 500 or certain steps thereof may apply to some files while other steps may not, and any combination of the steps may apply depending on the file type and context.

According to some embodiments, the signified non-textual content may include any files, objects, elements or data structures that are represented electronically but signify something other than text such that basic comparing/merging functionalities may be impaired as a result of ambiguous inaccurate or dependent representations of various elements and sub-element therein, for example: geometries, tones, physical properties, textures circuitries, flow charts, schematics and the like.

Examples of non-textual content may include data produced by visual programming tools such as LabVIEW and the like and contained in the associated file types. Data produced by Circuitry design tools such as SPICE and the like and contained in the associated file types. Data created by Flow-chart and graph design tools such as power-point and the like and contained in the associated file types. Data created by 2-D and 3-D object modeling tools such as SolidWorks and the like and contained in the associated file types. Data created by construction modeling tools such as AutoDesk, Revit and the like and contained in the associated file types. Examples may also include independent file types or exchange data structures not associated with specific software such as .STL (Stereo Lithographic Data) to signify Polygon Data, .IFC (Industry Foundation Classes) to signify Building Information Modelling and .IGES(Initial Graphics Exchange Specification) to signify manufacturing and circuitry data.

The above stated list of file formats and types is an exemplary list and other file types and tools (currently available, or to be presented) may apply, such as, and not limited to, any of the following file-types familiar to a person skilled in the relevant art:

Computer aided design (CAD) formats such as:
3dmlw, 3MF, ACP, AMF, AEC, AR, ART, ASC, ASM, BIN, BIM, BREP, CCC, CCM, CCS, CAD, CATDrawing, CATPart, CATProduct, CATProcess, CO, DRW, DFT, DGN, DGK, DMT, DXF, DWB, DWF, DWG, EASM, EDRW, EMB, EPRT, EscPcb, EscSch, ESW, EXCELLON, EXP, FM, FMZ, G, GBR, GLM, GRB, GTC, IAM, ICD, IDW, IFC, IGES, IPN, IPT, MCD, model, OCD, PAR, PIPE, PLN, PRT, PSM, PSMODEL, PWI, PYT, SKP, RLF, RVM, RVT, RFA, S12, SCAD, SCDOC, SLDASM, SLDDRW, SLDPRT, STEP, STL, TCT, TCW, UNV, VC6, VLM, VS, WRL, X_B, X_T, XE, Xenon and the like.

Electronic design automation (EDA) formats such as:
BRD, BSDL, CDL, CPF, DEF, DSPF, EDIF, FSDB, GDSII, HEX, LEF, LIB, MS12, OASIS, OpenAccess, SDC, SDF, SPEF, CIR, SREC, S19, STIL, S*P, WGL and the like.

Database formats, Geographic information system (GIS) formats such as

Graphics formats, vector graphics formats, 3D graphics formats, mathematical formats, presentation formats, project management formats, scientific data formats, imaging formats, and the like or any combination thereof, According to some embodiments, the systematic format is named ShapeDo format or SHPD format, and it is configured to represent complex data structures with ambiguities and/or dependencies in the original format in a systematic manner which is unambiguous and selected data elements are untangled from each other.

According to some embodiments, the revision control system is configured to provide merge capabilities between at least two branches, such that two branches are provided to the system, and a lowest common ancestor is detected to be selected as a reference/base to the diffs and merges.

Figure 6:
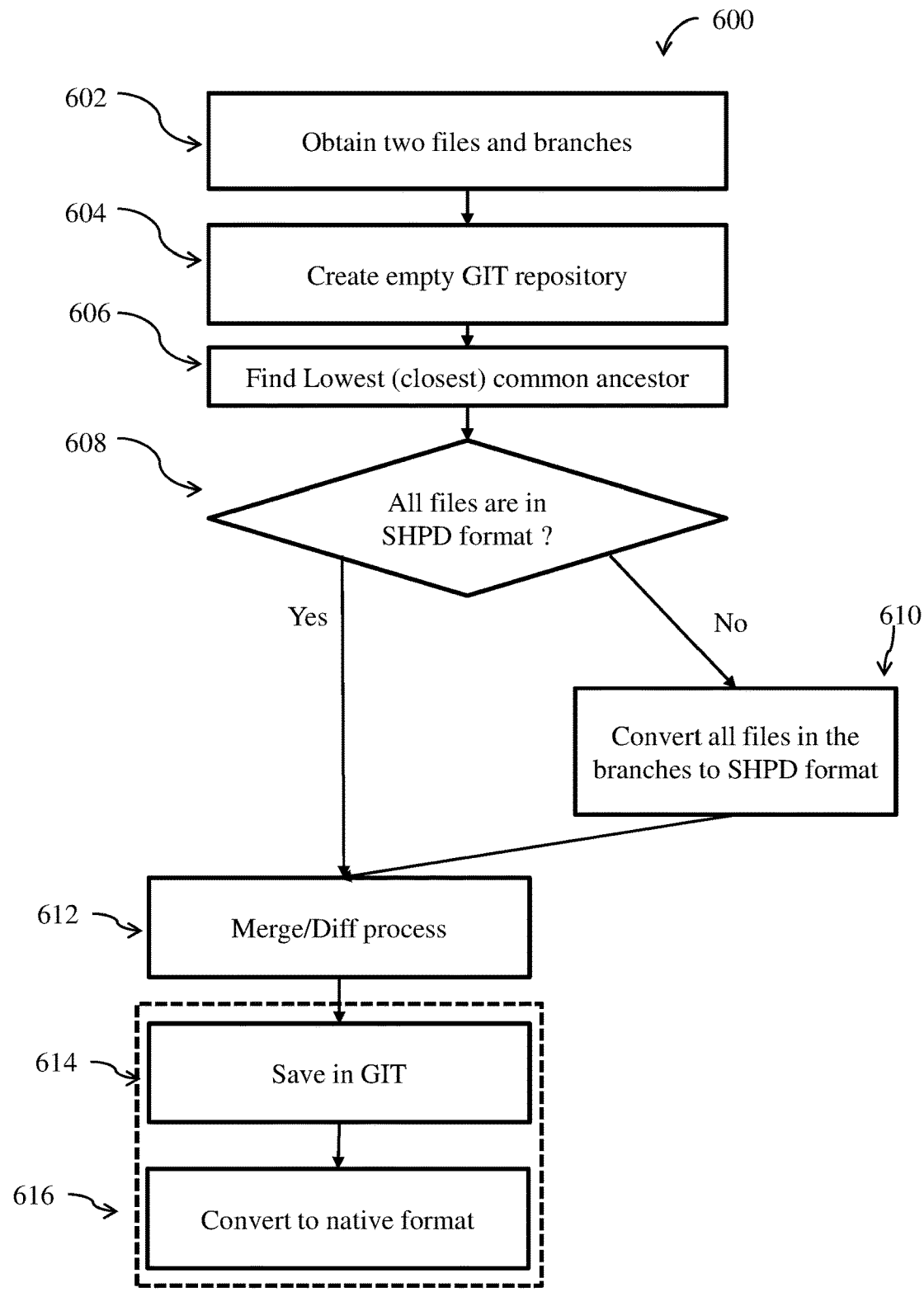
FIG. 6 schematically illustrates a method for file merging, according to some embodiments.

Reference is now made to FIG. 6, which schematically illustrates a method 600 for file merging, according to some embodiments. According to some embodiments, method 600 begins with obtaining at least two files or branches (step 602), then creating an empty repository, using standard version control system such as Git ("Git" is a free and open source distributed version control system designed to provide revision/version control capabilities) (step 604), and finding the closest common ancestor (step 606). Afterwards, method 600 proceeds with checking whether all files are formatted in the systematic SHPD format (step 608), and if all files are in SHPD format, we proceed to a merge/diff process (step 612), if not all files are in SHPD format, we first convert all possible files in the branches to SHPD format (step 610) and then proceed to the merge/diff process (step 612) and then, optionally, the merge is saved/committed in GIT (step 614) and optionally converted to native format (step 616).

Figure 7:
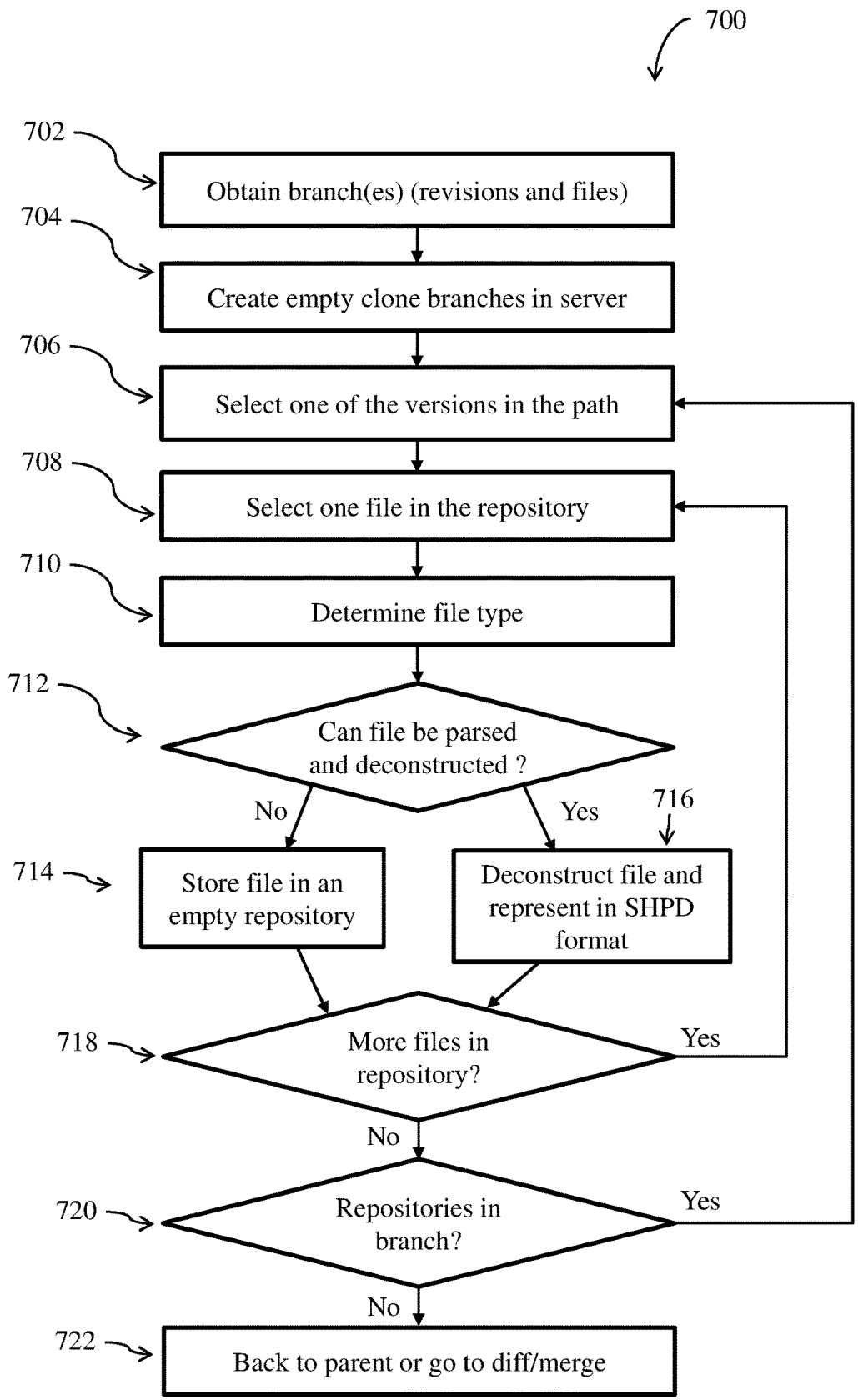
FIG. 7 schematically illustrates a method for converting files with non-textual content to a systematic format, according to some embodiments.

Reference is now made to FIG. 7, which schematically illustrates a method 700 for converting files with non-textual content to a systematic format (SHPD format), according to some embodiments. According to some embodiments, method 700 begins with obtaining a branch(es) or files (step 702), then creating empty clone branches in the server (step 704), then select a version in the path (step 706) and for each of the versions in the path select a file (step 708) and for each file in the version determine file type (step 710) and decide whether the file may be deconstructed (step 708). If the file is already deconstructed, the file may be stored in an empty repository (step 714), and if the file needs to be deconstructed, deconstruct the file and represent in SHPD format (step 716), and look for more files in the current version (step 718). If there are more files in the current version, select one of the files (step 708) and proceed as described above, and if there are no more files in the version, look for more versions in the branch (step 720). If there are more branches, select one of the branches (step 706) and proceed as described above, and if there are no more versions in the branch, go back to parent function or go to diff/merge tool (step 722).

According to some embodiments, method 700 may be an algorithm/method for implementing step 610 of method 600.

Figure 8:
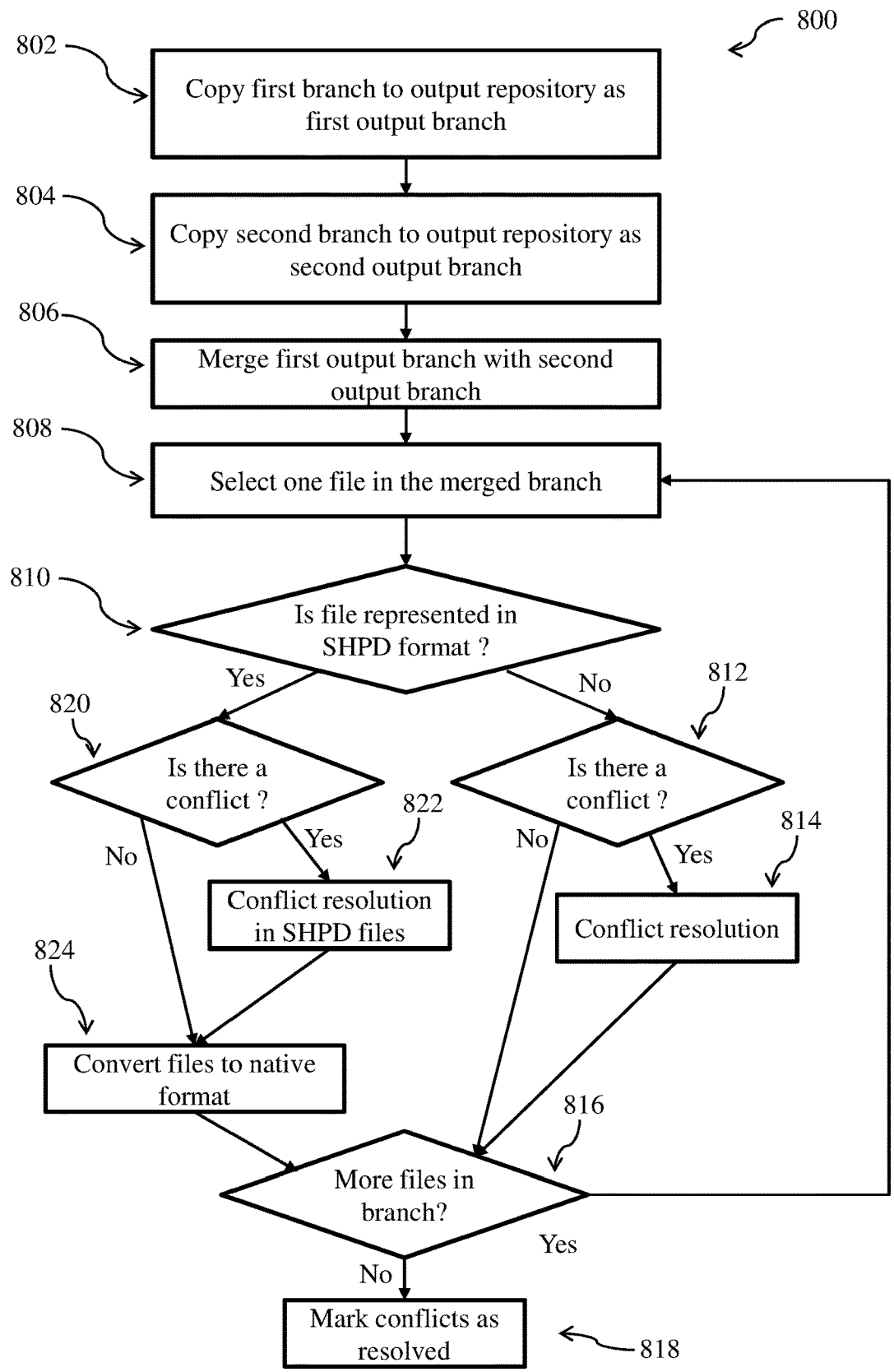
FIG. 8 schematically illustrates merging method of branches, according to some embodiments.

Reference is now made to FIG. 8, which schematically illustrates a merging method 800 of at least two branches, according to some embodiments. According to some embodiments, method 800 begins with copying one of the branches to the repository as a first output branch (step 802) and copying the second branch to the repository as second output branch (step 804) and merging the first output branch with the second output branch to create a merged branch (step 806), and for each of the files in the merged branch select a file (step 808) and check if the file is represented in the systematic SHPD format (step 810).

If the file is not represented in SHPD format, check if there is a conflict (step 812). If there is no conflict found in the file, search for other files in the branch (step 816), and if there is a conflict, initiate a conflict resolution process (step 814) which might be manual, then search for other files in the branch (step 816).

Alternatively, if the file is represented in SHPD format, check if there is a conflict in the file (step 820), and if a conflict is found, initiate conflict resolution process in SHPD files (step 822), then convert the file to the native format (step 824), and if there is no conflict, convert the file to native format without conflict resolution (step 824). Then, check if there are more files in the branch (step 816).

If there are more files in the branch, select a file (step 808) and proceed as described above, and if there are no more files in the branch, mark conflicts as resolved (step 818).

According to some embodiments, method 800 may be an algorithm/method for implementing step 612, step 614 and step 616 of method 600.

According to some embodiments, the process of revision control of non-textual content may be carried out by more than one server of computing entities.

Figure 9:
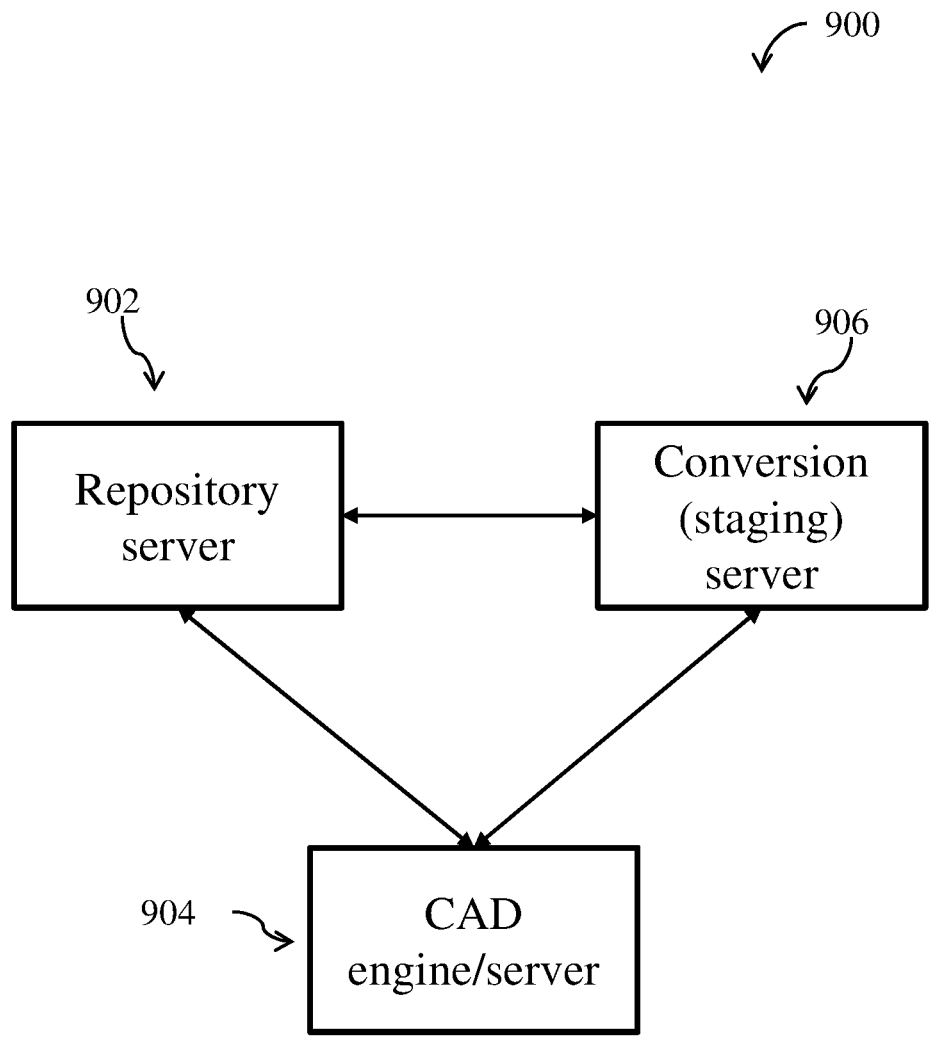
FIG. 9 schematically illustrates a system for revision control of files with non-textual content, according to some embodiments.

Reference is now made to FIG. 9, which schematically illustrates a system 900 for revision control of files signifying non-textual content, according to some embodiments. According to some embodiments, the system may include three servers, for example, a repository server 902 for maintaining the revisions and providing revision control functions and services, a conversion (staging) server 906, for converting the files to and from the systematic format, and an engine server 904, for providing the user with an interface to the non-textual content of the files, for example, for viewing, deleting, editing and creating files.

According to some embodiments, any of repository server 902, engine server 904 representations and/or conversion server 906 may be distributes, local, remote or configured in any combination/structure to provide the functionality as described herein.

Figure 10:
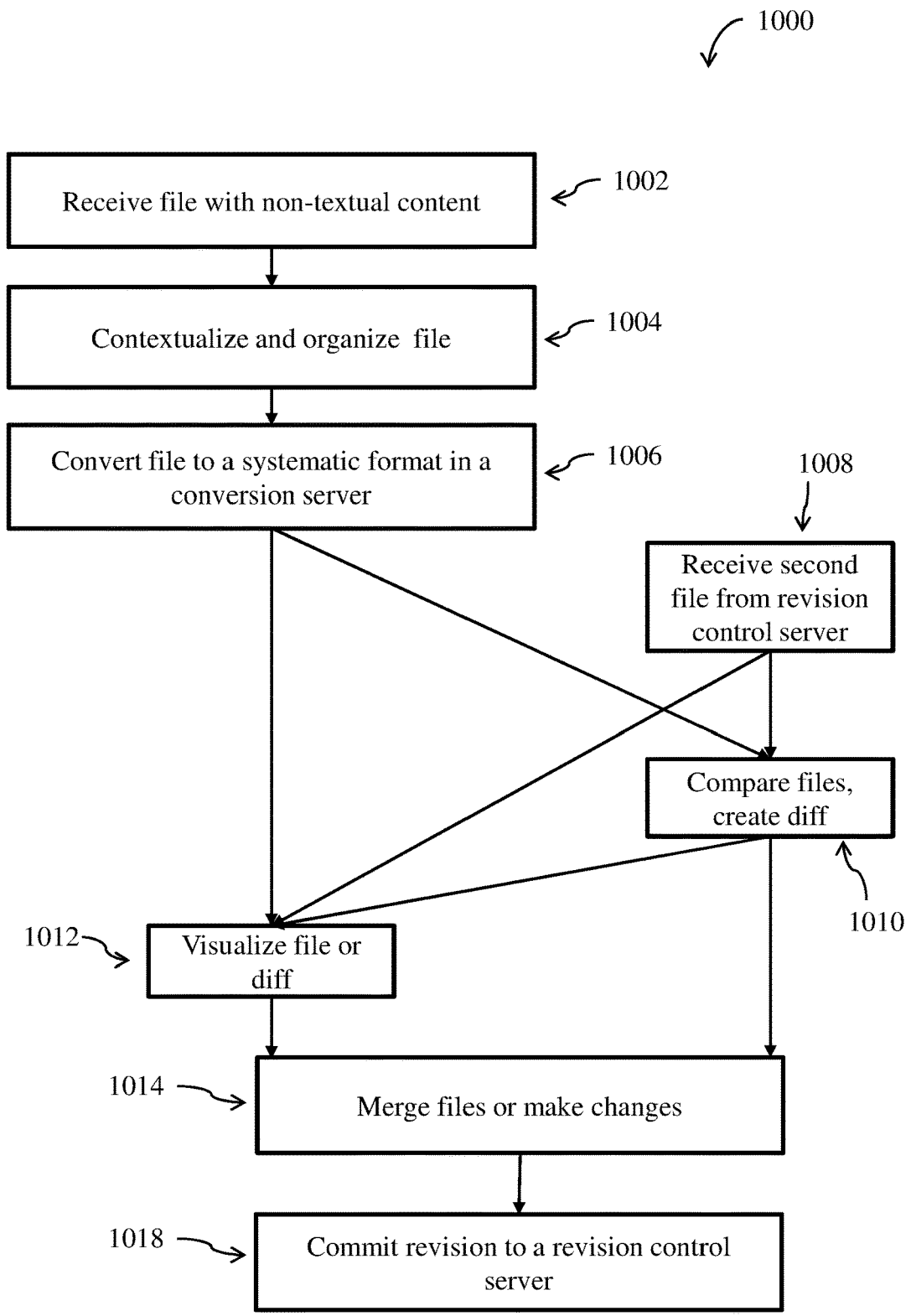
FIG. 10 schematically illustrates a method for a visualized diff and merge between files, according to some embodiments.

Reference is now made to FIG. 10, which schematically illustrates a method 1000 for a merge and/or visualized diff between files, according to some embodiments. According to some embodiments, method 1000 begins with receiving an electronic file signifying non-textual content (step 1002), then contextualizing and organizing the file (step 1004) and converting the file to a systematic format in a conversion server (step 1006). The method may receive another file from a revision control server (step 1008) and compare and/or create diff between the first file and the second file (step 1010).

According to some embodiments, method 1000 may proceed with merging the files or making changes to the files (step 1014) and committing the changes to the revision control server (step 1018), or provide a visualized preview of one of the files and/or the diff between the files (step 1012) and then merge the files (step 1014).

According to some embodiments, the non-textual content may include basic geometric shapes such as polygons, which may be represented in various representations.

Figure 11A:
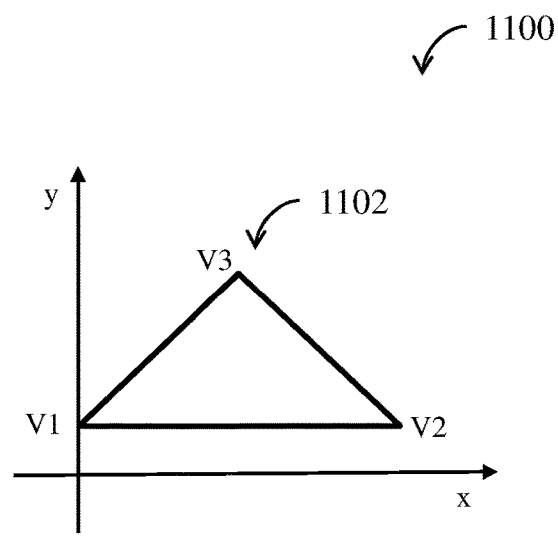
FIG. 11a schematically illustrates a representation of an elementary geometric shape, according to some embodiments.

Reference is now made to FIG. 11a, which schematically illustrates a setting 1100 of an elementary geometric element, according to some embodiments. According to some embodiments, a basic polygon, such as triangle 1102 may be represented in different ways, for example, by the coordinates of the three corners, and any permutation of the order in which the three corner coordinates are presented, by a combination of a vector and two points, two vectors and a point and any permutation of the order and/or the vector and point selection. One possible representation of triangle 1102 may be done by stating the three vertices or points in space V1, V2, V3 and the connections (links) therebetween.

Even if we chose this particular representation method, one may represent the same triangle in numerous permutations such as V1V2V3, V2,V1,V3, V3,V2,V1 and more, in total there are an order of O(N!) permutations that describe the exact same triangle. This same ambiguity also exists in more complex geometries. As a result, if a revision control system attempts to compare between files containing data signifying even identical simple structures, the representation ambiguity may render the comparison unfeasible. The ambiguity in the representation is more common than one may think, as even the same tool(CAD), running on the same system, may represent the same shape differently at different times, for example due to memory allocation status of the system, operating system status, system load, or even due to non-consistent arbitrary selection of permutation (orientation).

According to some embodiments, the representation in the systematic format may be done by selecting an orientation (one of the order permutations) of the element based on a predetermined rule or set of rules, and then each of the components may be defined/presented in a consistent order according to the selected orientation. For example, any permutation of triangle 1102, received from the original file will be represented only as V1,V2,V3 in the systematic file, and not by any other permutation/orientation. As a result, in a file which includes the triangle 1102, triangle 1102 will always be represented in the exact same digital form, and as a result the system will always know whether triangle 1102 has changed, regardless of all other changes that may have transpired in the file.

As a result, the representation of each element is consistent, and comparing various elements and files is facilitated, enabling the methods and functions of version control, previously available only to textual files (or files with text as the significant building block or data signifying textual information).

Figure 11B:
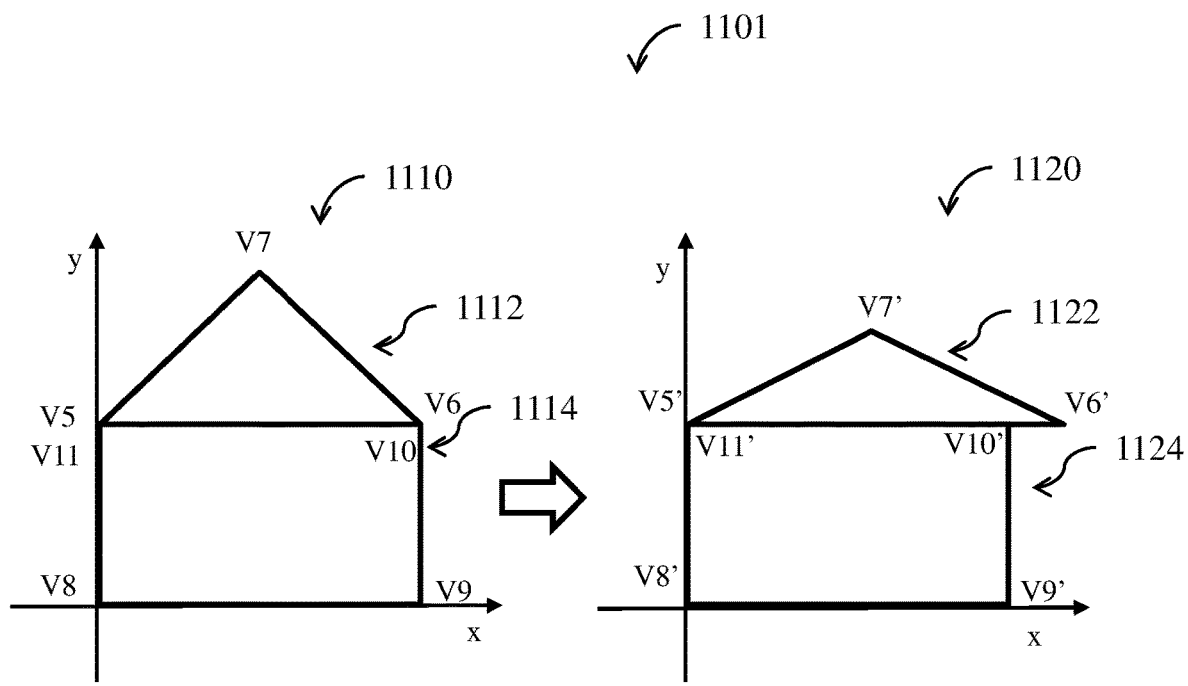
FIG. 11b schematically illustrates changes in a structure of two shapes, according to some embodiments, and FIG. 12 schematically illustrates merging changes between two branches, according to some embodiments.

Reference is now made to FIG. 11b, which schematically illustrates a setting 1101 of changes in a structure of two elements, according to some embodiments. According to some embodiments, a first structure 1110, includes a triangle 1112, and a rectangle 1114. In conventional representation formats, first structure 1110 may be described as a set of vertices:

[V8[0,0], V9[2,0], V6[2,1], V5[0,1], V7[1,2]] or any order of the vertices.

And edges that define first structure 1110 as triangle 1112 and rectangle 1114 based on the vertices, for example:

[[V8,V9,V6,V5],[V5,V7,V6]]

Or any other permutation (orientation) of the edges, some exemplary permutations include:

{
[V8[0,0], V9[2,0], V6[2,1], V5[0,1], V7[1,2]],
[[V5,V8,V9,V6],[V5,V7,V6]]
}
[V8[0,0], V9[2,0], V6[2,1], V5[0,1], V7[1,2]]
[[V8,V9,V6,V5],[V7,V6,V5]]
}
{
V8[2,0], V9[0,0], V6[2,1], V5[0,1], V7[1,2]
[[V6,V5,V8,V9],[V5,V7,V6]]
}
{ V8[2,0], V9[0,0], V6[2,1], V5[0,1], V7[1,2]
[[V9,V6,V5,V8],[V6,V5,V7]]
}

And many more.

And when a change is made, and a new structure 1120 results from the change, in conventional representation formats, new structure 1120 may be described as a set of vertices:

[V8'[0,0], V9'[2,0], V10'[2,1], V5'[0,1], V6'[2.5,1], V7'[1,2]], or any order of the vertices.

And edges that define first structure 1120 as triangle 1122 and rectangle 1124 based on the vertices, for example:

Or any other permutation (orientation) of the edges, some exemplary permutations include:

```
{
[V8'[0,0], V9'[2,0], V10'[2,1], V6'[2.5,1], V5'[0,1], V7'[1,2]],
[[V5',V8',V9',V10'],[V5',V7',V6']]
}
[V8'[0,0], V9'[2,0], V10'[2,1], V6'[2.5,1], V5'[0,1], V7'[1,2]]
[[V8',V9',V10',V5'],[V7',V6',V5']]
}
{
V8'[2,0], V9'[0,0], V6'[2.5,1], V10'[2,1], V5'[0,1], V7'[1,2]
[[V10',V5',V8',V9'],[V5',V7',V6']]
}
{
V8'[2,0], V9'[0,0], V6'[2.5,1], V5'[0,1], V10'[2,1], V7'[1,2]
[[V9',V10',V5',V8'],[V6',V5',V7']]
}
```

And many more.

In all orientations and in both structures, the representations of the triangle and the rectangle are tangled, and have shared vertices, for example V5 and V6 in first structure 1110 and V5' in new structure 1120. And detecting what elements have changed and what elements stayed the same is not possible, both because of the possible permutations of representation, and the dependencies in the representation of the various elements.

According to some embodiments, a systematic representation of first structure 1110 is done by rounding the values of the vertices, and untangling the dependencies such that first structure 1110 may be described as a set of vertices:

[V8[0,0], V9[2,0], V10[2,1], V6[2,1], V11[0,1], V5[0,1], V7[1,2]]

And the order of representing the sub elements of triangle 1112 and rectangle 1114 may be determined, and the orientation of each of the elements (triangle 1112 and rectangle 1114) is also determined, such that the edges that define first structure 1110 as triangle 1112 and rectangle 1114 based on the vertices are ordered and there is no dependency between the representation of triangle 1112 and rectangle 1114, for example:

[[V8,V9,V10,V11],[V5,V7,V6]]

And when a change is made, for example, moving V6 to V6', new structure 1120 results, the representation may be described as a set of vertices:

[V8'[0,0], V9'[2,0], V10'[2,1], V6'[2.5,1], V11'[0,1], V5'[0,1], V7'[1,2]]

And the representation of triangle 1122 and rectangle 1124, is:

[[V8', V9', V10', V11'],[V5',V7', V6']]

And comparing between first structure 1110 and new structure 1120 is done for example by comparing the representations, and such a comparison will show that only the triangle was changed, and that the change is that V6 was changed from [2,1] to V6'[2.5,1].

According to some embodiments, the orientation of an element/shape may be done as follows:

For example for triangle 1112, one of the permutations may be selected:

[V7, V6, V5], and then a cyclic rotate-left of the vertices is performed, and the permutation that meets a certain rule, for example minimal binary value of the representation, is selected, in this case:

[V5, V7, V6]. In such a representation, if the triangle is not changed between files, the representation will be the same as well.

Figure 12:
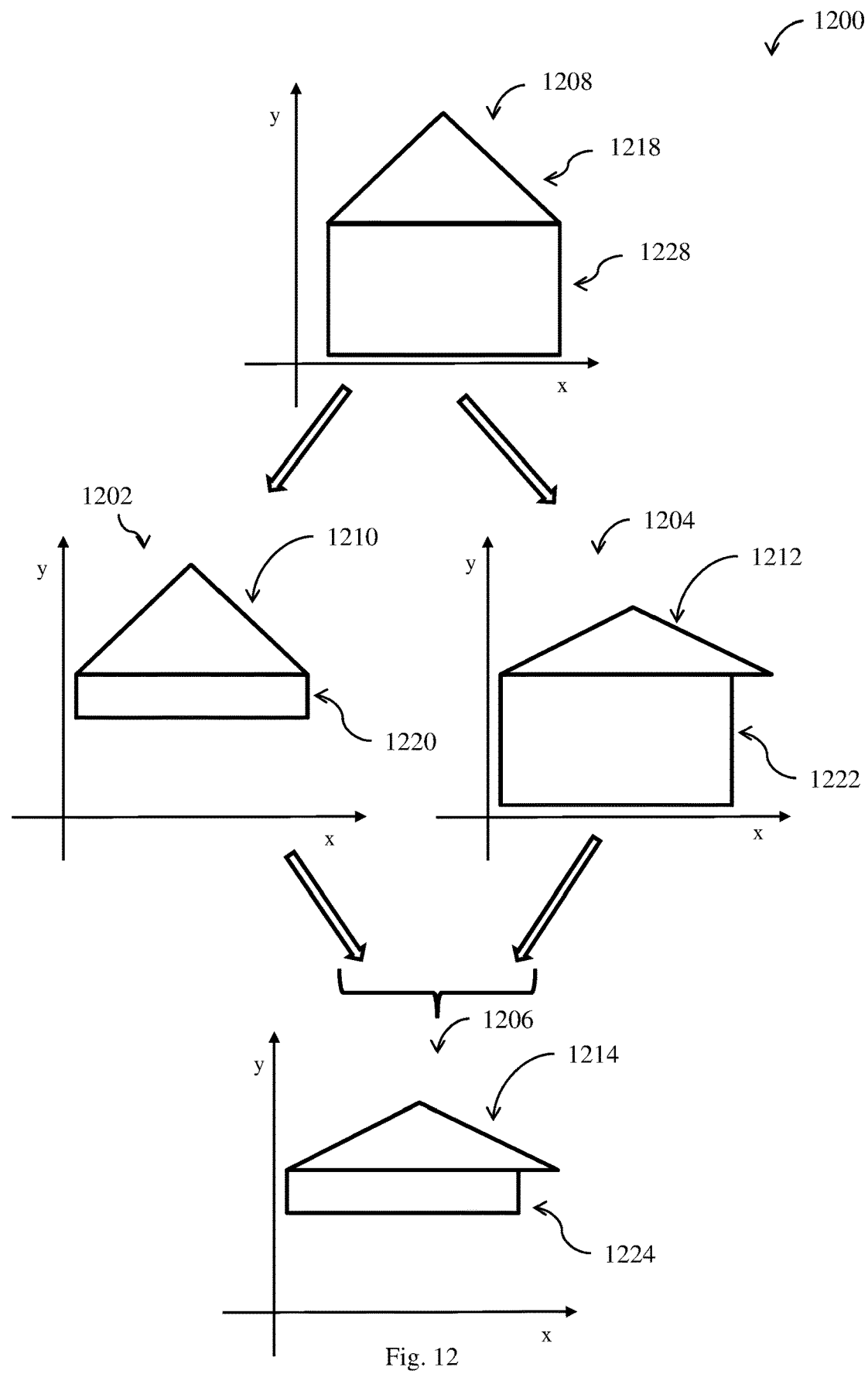

Reference is now made to FIG. 12, which schematically illustrates a setting 1200 of merging changes between two branches, according to some embodiments. According to some embodiments, an original structure 1208 is presented including a triangle 1218 and a rectangle 1228, one user made a branch and performed some edits to create a first structure 1202 by changing the height of the original rectangle to create first rectangle 1220, and the triangle 1210 stayed unchanged as the original triangle, and another user made a different branch from original structure 1208 and performed independent edits to create a second structure 1204 by elongating the triangle to create second triangle 1212 while the rectangle 1222 stayed the same as the original.

With the SHPD representation of the objects, one may create a merged structure 1206 by selecting objects from either first structure 1202 or second structure 1204. For example, merged structure 1206 may include the changes done in first structure 1202 compared to original structure 1208 and also include the changes done in second structure 1204 compared to original structure 1208. In this case, no conflict exists as each of the branches entailed changes in different objects/elements, and the untangling of the elements in the SHPD representation enables identifying unchanged elements in an otherwise tangled structure. And merged structure may include third triangle 1214 which is selected from second structure 1204, while third rectangle 1224 is selected from first structure 1202. According to some embodiments, untangling the elements in the systematic representation enables such a merge of structures.

An example for the difference between common representations and the SHPD representation can be illustrated by representing a cube:

Common computers may save the cube by a list of vertices, then a list of edges referring to the vertices from the list as indexes, and then storing the data in an unrounded binary form.

According to some embodiments, a systematic representation may include: a list of edges with a list of vertices for each edge, thereby untangling dependencies, then the representation of each element is arranged in an orientation based on a predetermined rule or set of rules (for example, alphanumeric sorting of sub-elements, to form a surjective function), and each element is placed in a separator to be separated in the representation from other elements.

In a commonly used OBJ format, the cube may be represented as follows:

o Cube
v 1.000000 -1.000000 -1.000000
v 1.000000 -01.000000 1.000000
v -1.000000 -1.000000 1.000000
v -1.000000 -1.000000 -1.000000
v 1.000000 1.000000 -0.999999
v 0.999999 1.000000 1.000001
v -1.000000 1.000000 1.000000
v -1.000000 1.000000 -1.000000
s off
f 1 2 3 4
f 5 8 7 6
f 1 5 6 2
f 2 6 7 3
f 3 7 8 4
f 5 1 4 8

And an OBJ file representation in JSON may be:

[{"4": "b 'Cube'", '0": [[1.0, -1.0, -1.0], [1.0, -1.0, 1.0], [-1.0, -1.0, 1.0], [-1.0, -1.0, -1.0],[1.0, 1.0, -0.999999], [-1.0, 1.0, -1.0], [-1.0, 1.0, 1.0], [0.999999, 1.0, 1.000001]], "1": [[0, 1, 2, 3], [4, 5, 6, 7], [0, 4, 7, 1], [1, 7, 6, 2], [2, 6, 5, 3], [4, 0, 3, 5]]}]

While a SHPD form of the OBJ file may be:
O Cubes
S off
[1, [[−1.0, −1.0, −1.0], [−1.0, 1.0,−1.0], [1.0, 1.0, −1.0], [1.0, −1.0, −1.0]]]
[1, [[−1.0, −1.0, 1.0], [−1.0, −1.0, −1.0], [1.0, −1.0, −1.0], [1.0, −1.0, 1.0]]]
[1, [[−1.0, 1.0, −1.0], [−1.0, −1.0, −1.0], [−1.0, −1.0, 1.0], [−1.0, 1.0, 1.0]]]
[1, [[−1.0, 1.0, 1.0], [−1.0, −1.0, 1.0], [1.0, −1.0, 1.0], [1.0, 1.0, 1.0]]]
[1, [[1.0, 1.0, −1.0], [−1.0, 1.0, −1.0], [−1.0, 1.0, 1.0], [1.0, 1.0, 1.0]]]
[1, [[1.0, 1.0, −1.0], [1.0, 1.0, 1.0], [1.0, −1.0, 1.0], [1.0, −1.0, −1.0]]]

As used herein, the terms "revision" and "version" are interchangeably used and refer to different edits or stages of edits of a certain file.

As used herein, the terms "object" and "element" are interchangeably used, and refer to parts of the non-textual content signified by data in the electronic file. According to some embodiments, the objects/elements may include basic building blocks of the signified non-textual content.

As used herein, the term "signifying non-textual content" refers to computer readable information that represents non-textual objects, such as shapes, wirings, models and the like that may have various ambiguous representations for describing the same element or structure.

As used herein, the term "complex data structure" refers to data signifying non-textual content.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" or "comprising," when used in this specification, specify the presence of stated features, integers, steps, operations, elements, or components, but do not preclude or rule out the presence or addition of one or more other features, integers, steps, operations, elements, components, or groups thereof.

While a number of exemplary aspects and embodiments have been discussed above, those of skill in the art will recognize certain modifications, additions and sub-combinations thereof. It is therefore intended that the following appended claims and claims hereafter introduced be interpreted to include all such modifications, additions and sub-combinations as are within their true spirit and scope.

The invention claimed is:

1. A method for merging electronic files having non-textual content, the method comprising:
   obtaining a first electronic file in a first format and a second electronic file in a second format, said first file and said second file having non textual content; wherein the first electronic file and said second electronic file originate from a same original electronic file;
   converting each of the first electronic file and the second electronic file into a systematic format, wherein the converting comprises detangling dependencies of interdependent ambiguous structures within the non-textual content into independent substructures;
   merging the converted first electronic file and the converted second electronic file into a merged electronic file, wherein the merging comprises
   identifying differences in the independent substructures of the first and second electronic files, the differences being indicative of editorial changes made in the first and/or second electronic file prior to the merging; and
   combining the edited substructures into a revised intertangled structure.

2. The method of claim 1, further comprising converting the merged electronic file to the first format and/or the second format.

3. The method of claim 2, wherein the first format and the second format are different formats.

4. The method of claim 1, wherein converting the file and/or second electronic file into the systematic format comprises translating the ambiguous structures into a same order of geometric-data-representation by applying a predetermined rule or set of rules on the non-textual content.

5. The method of claim 4, wherein the predetermined rule or set of rules is surjective.

6. The method of claim 1, wherein converting the file and/or second electronic file into the systematic format comprises rounding one or more values associated with the non-textual format to a predetermined resolution.

7. A revision control method for electronic files representing non-textual content, the method comprising:
   obtaining a first electronic file, comprising data having non-textual content in a first format;
   detangling dependencies of structures within the non-textual content data, thereby deconstructing the structures into independent substructures having a representation in the first format;
   converting the representation of the substructures from the first format to a systematic format;
   aggregate the representation of the substructures in the systematic format, to generate a second electronic file comprising data having the non-textual content in the systematic format;
   wherein methodically converting the representation of the substructures from the first format to the systematic format comprises
   utilizing a surjective representation of the substructures; and
   rounding one or more values associated with the non-textual format to a predetermined resolution.

8. The method of claim 7, further comprising:
   storing the second electronic file in a repository server, the repository server configured to store versions/revisions of files for providing version/revision control for the files.

9. The method of claim 7, further comprising:
   comparing the second electronic file with a third file, the third file comprising data having non-textual content in the systematic format.

10. The method of claim 9, further comprising:
    generating a comparison report indicative of differences and/or commonalities between the second electronic file and the third electronic file.

11. The method of claim 10, further comprising:
    generating a merged file in the systematic format by merging the second electronic file with the third electronic file.

12. The method of claim 10, further comprising:
    generating a merged file by selecting an origin of differences from the comparison report, the origin of differences being the second electronic document or the third electronic document.

13. The method of claim 9, further comprising:
providing a non-textual (visual) comparison between the second electronic file and the third electronic file by presenting the comparison report in a non-textual representation.

14. The method of any of claim 7, wherein the non-textual content comprise geometric content and the systematic textual format comprises a surjective representation of polygons and/or Non-uniform rational basis splines (NURBS) based on coordinates and/or vector properties.

15. The method of claim 14, wherein the geometric content comprises a three-dimensional model for 3D-printing.

16. The method of claim 14, wherein the geometric content comprises a three/two-dimensional model for a construction plan.

17. A revision control system for electronic files representing non-textual content, the system comprising:
a non-transitory memory, configured for storing thereon a repository revision of an electronic file; and
a processing circuitry configured to:
obtain a first electronic file, comprising data having non-textual content in a first format;
detangle dependencies of interdependent ambiguous structures within the non-textual content data, thereby deconstructing the structures into independent substructures having a representation in the first format;
convert the representation of the substructures from the first format to a systematic format
aggregate the representation of the substructures in the systematic format, to generate a second electronic file comprising data having the non-textual content in the systematic format;
wherein methodically converting the representation of the substructures from the first format to the systematic format comprises
utilizing a surjective representation of the substructures; and
rounding one or more values associated with the non-textual format to a predetermined resolution.

18. The system of claim 17, wherein said processing circuitry is further configured to:
store the second electronic file in a repository server, the repository server configured to store versions/revisions of files for providing version/revision control for the files.

19. The system of any of claim 17, wherein said processing circuitry is further configured to:
compare the second electronic file with a third file, the third file comprising data having non-textual content in the systematic format.

20. The system of claim 19, wherein said processing circuitry is further configured to:
generate a comparison report indicative of differences and/or commonalities between the second electronic file and the third electronic file.

* * * * *